May 2, 1967 H. R. BEELITZ 3,316,619

METHOD OF MAKING CONNECTIONS TO STACKED PRINTED CIRCUIT BOARDS

Filed Dec. 9, 1963

3 Sheets-Sheet 1

INVENTOR
HOWARD R. BEELITZ
BY
ATTORNEY

May 2, 1967 H. R. BEELITZ 3,316,619

METHOD OF MAKING CONNECTIONS TO STACKED PRINTED CIRCUIT BOARDS

Filed Dec. 9, 1963 3 Sheets-Sheet 2

INVENTOR.
HOWARD R. BEELITZ
BY
[signature]
ATTORNEY

May 2, 1967 H. R. BEELITZ 3,316,619

METHOD OF MAKING CONNECTIONS TO STACKED PRINTED CIRCUIT BOARDS

Filed Dec. 9, 1963 3 Sheets-Sheet 3

INVENTOR

HOWARD R. BEELITZ

BY Samuel Cohen

ATTORNEY 3,316,619

METHOD OF MAKING CONNECTIONS TO STACKED PRINTED CIRCUIT BOARDS

Howard R. Beelitz, Franklin Park, N.J., assignor to Radio Corporation of America, a corporation of Delaware Filed Dec. 9, 1963, Ser. No. 328,914
6 Claims. (Cl. 29—155.5)

This invention relates to the interconnection of electrical circuits and, more particularly, to the interconnection of conductors printed on insulator substrates such as "cards."

In the arrangement of the invention, electrical circuits which may include conductors, resistors and other elements, are printed, silk screened, stenciled or otherwise formed on the surface of a card. Terminals which connect to the circuits, and which may be formed at the same time as the circuits, are located on the same surface of the card as a circuit, and along one edge of the card. The terminals are selectively punched from the cards so that when the cards are stacked a terminal on a card which lies beneath one or more punched terminals is exposed. Connection may be made to this exposed terminal by means of a spring or other type connector. Alternatively, connection may be made by turning the stack of cards on edge, placing a low melting point solder in the indentation at the edge of the stack formed by the punched out terminals and melting the solder to provide a connection point. The terminal may be placed into the melted solder and the solder then permitted to harden or the solder may be permitted to harden and a connection made to the hardened solder by means of a spring terminal.

The invention is discussed in greater detail below and is shown in the following drawings of which:

Figure 3A:
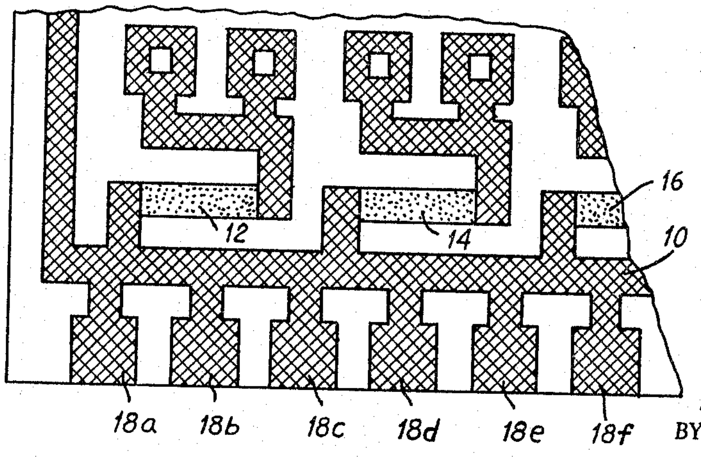
Figures 3B, 3C:
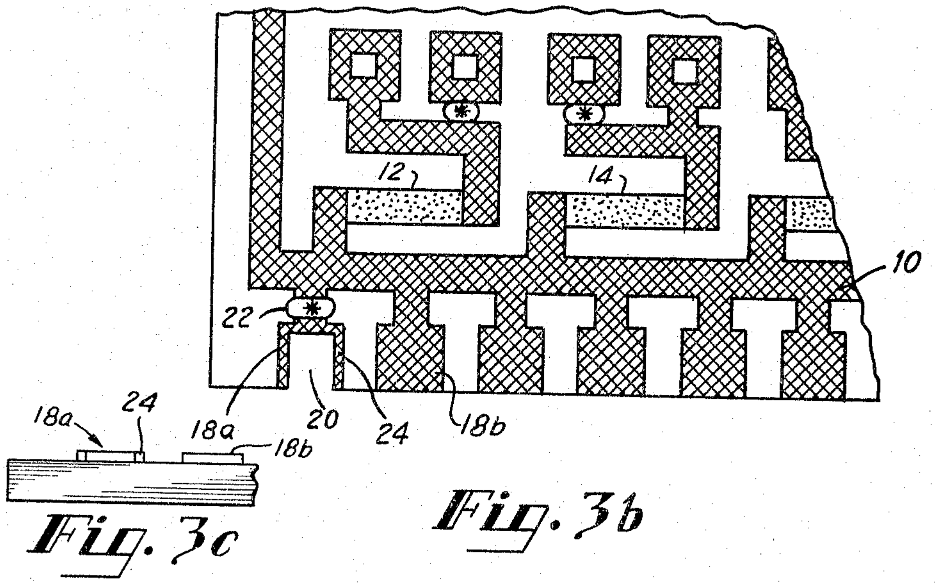

FIGS. 3*a* and 3*b* are plan views of portions of a memory card according to the present invention;

FIG. 3*c* is an enlarged on-edge view of a portion of the card of FIG. 3*b*.

Figure 4:
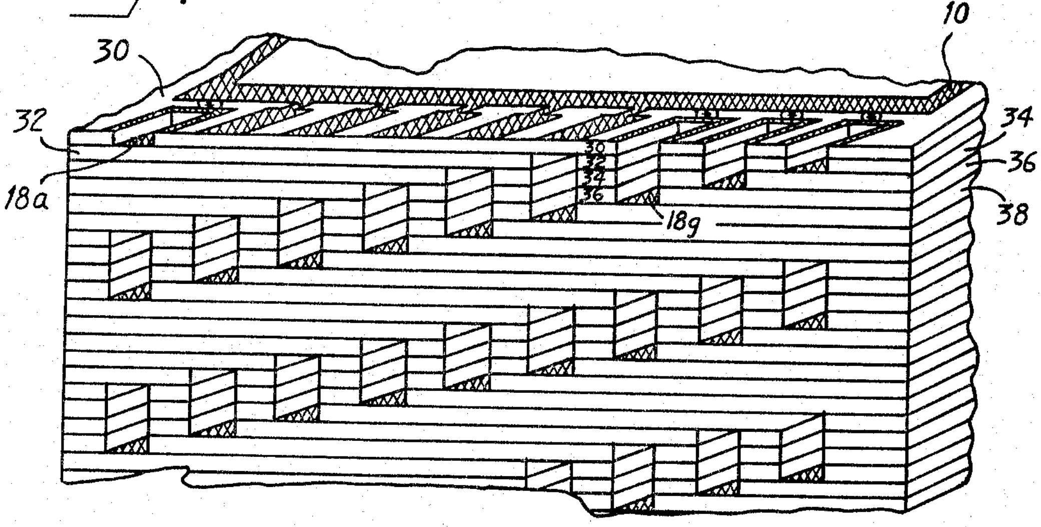
Figure 6:
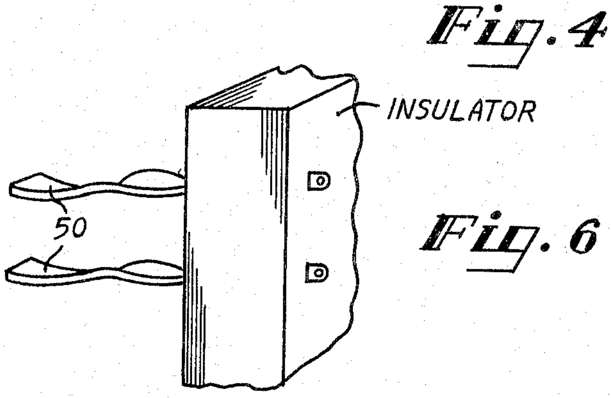
Figure 5:
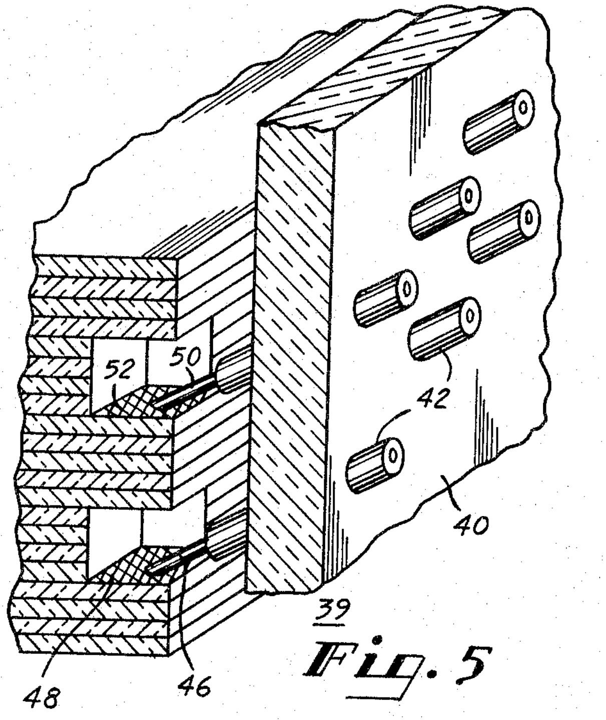
Figure 7:
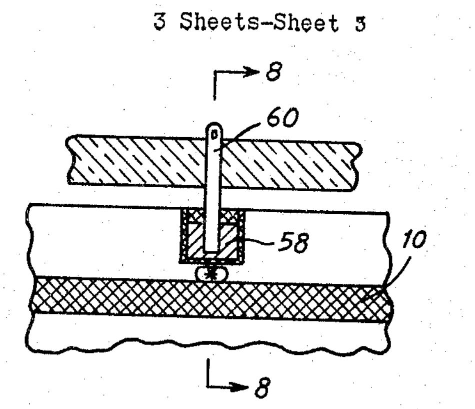
Figure 8:
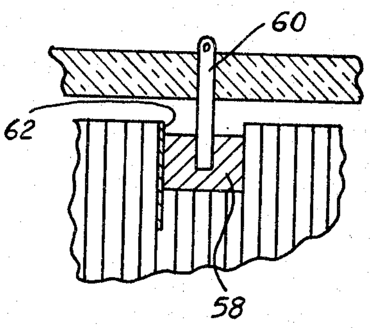
Figure 9:
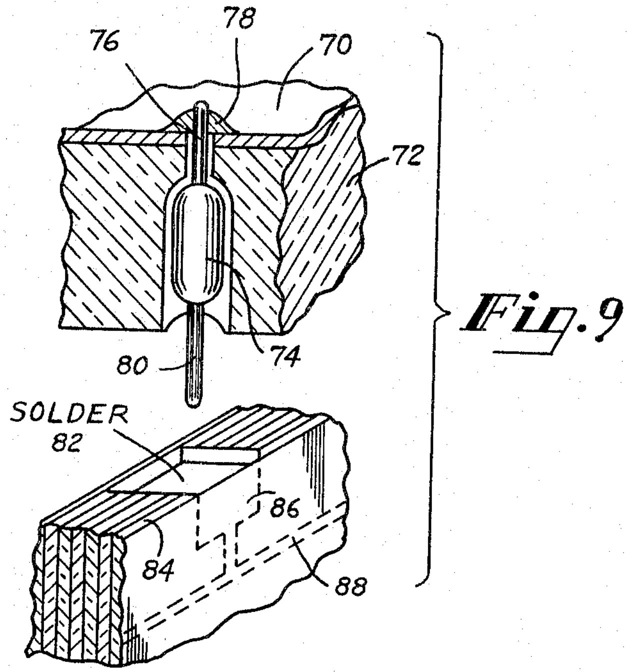
Figure 10:
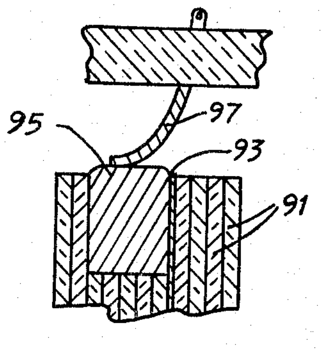

FIG. 4 is a perspective view of a portion of a stack of memory cards such as shown in FIG. 3*b*;

FIG. 5 is a perspective, cross-sectional view of a portion of the stack of cards with a multiple element connector in place;

FIG. 6 is a perspective view of a portion of another type of connector which may be used to connect to the cards in a stack;

FIG. 7 is a cross-section through a pack of cards showing another way in which connection may be made to the terminals;

FIG. 8 is a cross-section along line 8—8 of FIG. 7;

FIG. 9 is an exploded, perspective view of another way of connecting to a stack of cards; and FIG. 10 is a cross-sectional view through a portion of a pack of cards illustrating another connection method.

Figure 1:
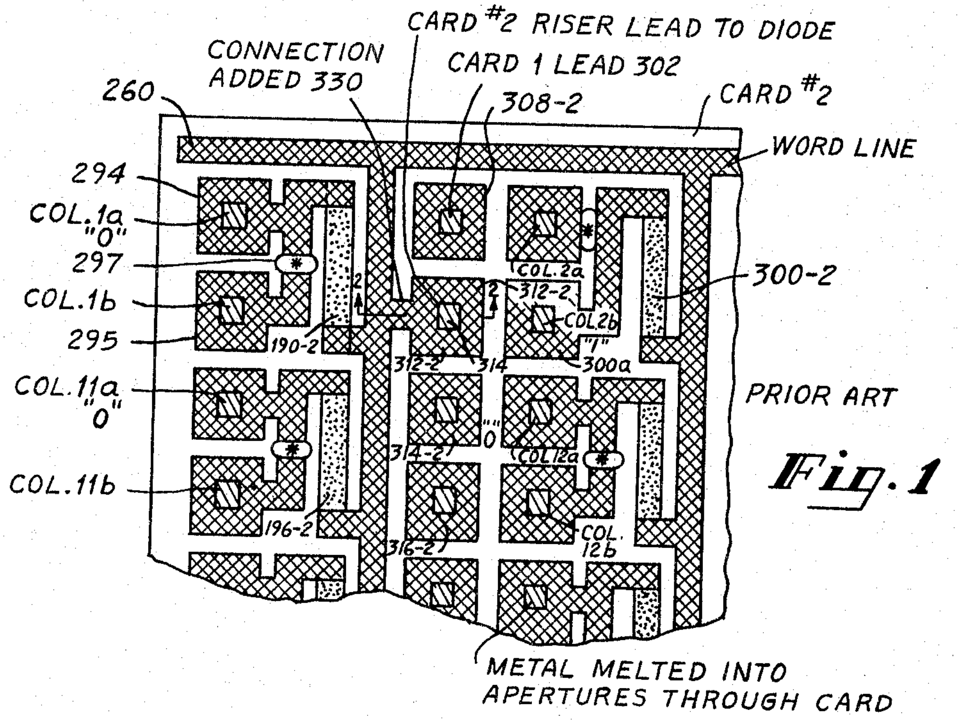
FIG. 1 is a plan view of a portion of a prior-art memory card.

The card shown in FIG. 1 is described in detail in copending application Ser. No. 294,288, filed July 11, 1963 by H. R. Beelitz and assigned to the same assignee as the present invention. In brief, the card of FIG. 1, only a portion of which is shown in the figure, is a memory circuit which is capable of storing binary bits. The storage elements are resistors such as shown at 190–2, 196–2, 300–2, and so on. These resistors are all connected at one end to a common word-line 260. Each resistor is initially connected at its other end to two terminals as, for example, 294 and 295.

Information is written into a card by punching holes in the card as is indicated by the asterisks. A hole disconnects one of the two terminals from the resistor. For example, the hole 297 disconnects terminal 295 from resistor 190–2. This resistor is therefore connected only to terminal 294 and, so connected, represents storage of the binary digit (bit) zero. The resistor 300–2, on the other hand, is connected to terminal **300*a*** and represents storage of the bit one.

The various terminals on the cards are connected to external circuits by means of riser columns such as columns **1*a*, 1*b*** and so on. The riser columns are preferably made of low-melting-point metal alloy, such as a low-melting-point solder, which is poured into the aligned apertures in the cards.

It is also desired to connect the common word-line 260 on the various cards to circuits external of the cards. For example, in the circuits of FIGS. 8 and 9 of the copending application, the respective common word lines are connected, each through a diode (diodes 190, 192 and 194 of the figures) to a common lead to an interrogation circuit. This connection is made, in each case, by terminals, and riser columns which connect it to the terminals.

The terminals for the word line appear in FIG. 1 at 308–2, 312–2, 314–2, 316–2, and so on. Initially, these terminals are all disconnected from the word-line 260. To connect a particular word line to a particular riser lead for the word line, a connection is printed, painted or otherwise formed between the word line and the terminal. The word-line 260 on the card shown is connected to terminal 312–2 by means of added connection 330.

Figure 2:
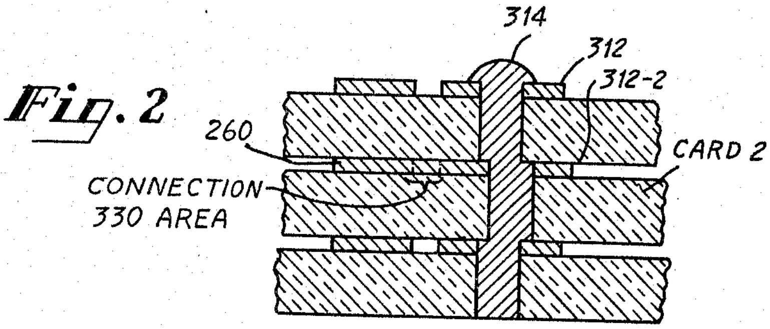
Fig. 2 PRIOR ART
FIG. 2 is a section taken along line 2—2 of FIG. 1.

A cross-section through the card of FIG. 1 at the terminal 312–2 is shown in FIG. 2. The riser lead 314 connects to the terminal 312–2 which in turn is connected via the conductor area 330 to the common word-line 260. The riser lead 314 also connects to corresponding terminals on the cards above and below card 2. However, these terminals, such as 312, are not connected to the common word-lines 260 on their respective cards so that the riser 314 does not make connection to the common word-lines 260 on the other cards.

As may be seen in FIG. 2, it is advantageous slightly to stagger the terminals on the cards with respect to one another in order to achieve larger area contact between the riser lead and the terminal. The copending application discusses a number of different ways this may be accomplished.

The method of connection to the word lines discussed above is advantageous in that all of the cards, as supplied by the factory, can be identical. However, the method does have its disadvantages. One is that the terminals for the riser leads for the word lines take up a substantial amount of the space on the card. For example, if it is desired to employ a stack of say 100 cards, which have continuous riser columns through the stack, then room must be provided on each card for 100 terminals such as 308–2, 312–2, 314–2, and so on.

Another disadvantage of the word line connection method above is that the diodes in the external circuits are located at the ends of the riser columns, a relatively long distance (perhaps 4–12 inches) from the memory elements on the cards. This introduces problems of distributed reactance due to the relatively long lead lengths and this in turn limits the operating speed of the memory.

The connection method of the present invention, as shown in FIGS. 3*a* and 3*b*, has neither of the above disadvantages. The word-line conductor is shown at 10 in FIG. 3*a*. It is connected in common to all of the memory elements on the card. Three such elements are shown at 12, 14 and 16 in FIG. 3*a*. The connection of the resistor storage elements to the terminals is the same as that discussed in the copending application above and therefore need not be discussed here. Connection to the word line is achieved via terminals 18 which are located on the same surface of the card as the memory elements and at an edge of the card.

As illustrated in FIG. 3*b*, connection may be made to a terminal on a card by punching two holes in the corresponding terminal in one or more cards above that card. FIG. 3*b* shows a first hole 20 and a second hole 22 punched through terminal 18*a*. The hole 22 severs the connection between the word line 10 and the terminal 18*a*. The hole 20 provides access to the terminal 18*a* in the card to which connection is to be made. The portion 24 which remains of the terminal 18*a* can serve as a gasket to prevent loss of a material such as solder, as is discussed later in connection with the embodiment of FIGS. 7–9.

A portion of a stack of cards with various terminals punched out is shown in FIG. 4. The terminal 18*a* punched out of card 30 permits a connection to be made to the terminal 18*a* on card 32. The terminal 18*g* punched out of cards 30, 32, 34 and 36 permits a connection to be made to the terminal 18*g* on card 38 and so on. As can be seen in FIG. 4, the punched-out areas on the successive cards are staggered to permit easy connection to the respective terminals. Only enough area need be set aside on any card for 9 terminals in the particular illustration. Nevertheless, the number of cards which may be placed in the stack is unlimited in view of the staggered terminal arrangement. The cards, as they come from the factory, may all be the same just as in the prior art. In this case, the cards are punched at the computer location by the operator making up the memory. Alternatively, the cards may be punched at their edges at the factory. An advantage of pre-punching the cards at their edges is that the user need not purchase the edge-notch cutting tool or machine. In either case, the expensive step of individually painting connections on cards is not needed.

FIG. 5 illustrates one way in which connection may be made between the respective terminals on the cards and external circuits. The multiple element connector 39 includes a block 40 of insulating material, and a pulrality of wire-brush connectors 42 embedded in the insulator block and positioned to engage the respective terminals in the stack of cards. The resilient wires 46, for example, make contact with the terminal 48. Similarly, the resilient wire 50 makes contact with the terminal 52.

Another type of connector which may be used with the stack of cards of FIG. 4 is shown in FIG. 6. Here the connector elements 50 embedded in the insulator are formed of spring metal. They make contact with the respective terminals in the same general way as shown in FIG. 5.

Yet another way of connecting to the terminals is illustrated in FIGS. 7 and 8. In this arrangement, the pack of cards is turned on edge with the openings formed by the cut-out terminals facing in the upward direction. Then a low-melting-point solder 58 is placed in each opening. Preferably the melting point of the solder is somewhat lower than that of the melting point of the solder employed for the riser columns which connect to the memory elements on the cards. This is to permit the former solder to be melted without melting the riser columns. The solder may be melted in any number of ways and the connector 60 may be immersed in the melted solder 58 and the solder permitted to cool. The terminal to which connection is made is shown in somewhat enlarged cross-section at 62 in FIG. 8.

The solder 58 may be placed in the various openings as preformed pellets which are shaped to conform to the openings or simply as balls, cubes, lumps or granulated metal. The solder may be melted by placing the entire stack of cards in an oven, or by induction heating. As an alternative, liquid solder may be poured into the various openings and permitted to solidify. Thereafter, the multiple element connector may be heated so that the pins 60 are at a temperature substantially higher than that required to melt the solder. The heating may be accomplished by heating elements embedded in the insulator block of the connector, or by other means. Then the multiple element connector may be placed in position and the pins permitted to melt their own way into the solder.

When the solder is melted, it should not flow out of the opening and between the cards. If it did flow between the cards, it could cause short circuits between conductors on the cards. However, the portion 24 of the punched out terminal is raised slightly above the surface of the card as shown in FIG. 3*c*, and forms a gasket between the cards when the cards are stacked. This gasket prevents the solder from flowing out of the opening 20.

An advantage of the arrangement of FIGS. 7 and 8 is that the connections made have very good mechanical and electrical properties. Further, the multiple element connector can be removed, simply by heating the stack and/or connector until the solder melts.

The exploded view of FIG. 9 shows still another way in which connection may be made to the terminals on the cards. The multiple-element connector includes a common backing element 70 which may be formed of a good conductor such as copper, secured to an insulator element 72. A plurality of diodes, one of which, 74, is shown, are located in openings in the insulator. One terminal 76 over each diode projects through an opening in the backing plate 70. The diodes may be secured in place by dip-soldering to produce connections such as 78 between the diode terminal and the plate 70. The other terminals 80 of the respective diodes are embedded in the solder 82 located in the apertures in the card. The solder connection may be made in any of the ways already discussed. The solder also connects to a terminal on card 84 as indicated by the phantom view at 86. The terminal in turn is connected to the word line connector 88.

The important advantage of the arrangement of FIG. 9 is that the diodes are very close to the cards. This reduces lead lengths and corresponding stray reactances, and permits higher-frequency operation of the memory circuits (see FIG. 1) on the cards.

An alternative connection method to the ones illustrated in FIGS. 7–9 is to employ a liquid conductor, such as mercury, instead of a low melting point solder. When mercury is used, the cards should be positioned on edge with the openings facing up so that the mercury does not spill out. Alternatively, a gasket having holes in positions corresponding to the openings formed by the cut-out terminals may be placed between the stack of cards and the multiple element connector and the connector secured against the gasket and stack to provide a tight seal.

Still another method of connecting to the word conductors in the stack is shown in FIG. 10. The openings in the side of the stack are made in the same way as discussed above. The cards are shown at 91 and the word-line conductor at 93. Solder 95 is poured into the apertures, one of which is shown, up to the surface or slightly above the surface of the stack of cards and then permitted to harden. Connection is made to the solder by means of spring connectors, one of which is shown at 97.

The purpose of using metal contact "buttons" such as discussed above is to permit the surface of electrical contact to be flush with or parallel to the side of the stack. One advantage of this arrangement is that the contact area is enlarged and the tolerance problems associated with the mating of the spring terminals are relieved. (Note that in FIGURE 5 the contact surface is at right angles to the side of the stack and its area is limited to a value somewhat smaller than that of a terminal 18.)

In the claims which follow, the term "printed" circuit or conductor is employed in a generic sense to describe a circuit or conductor on a surface of the card laid down by printing, silk screening, vacuum deposition, spraying, or other means.

What is claimed is:

1. A method of making connection to printed circuits on the surfaces of cards comprising the steps of:
forming each card with terminals in corresponding positions at an edge of the card, and on the same surface thereof as the circuit;
selectively punching the edges of the cards to remove at least a portion of each of a plurality of terminals;
stacking the cards in such manner that any punched out terminal portion on a card forms an opening along one side of the stack of cards which exposes the terminal on a card beneath the punched out terminal; and
placing a multiple element connector, which is adapted to mate with the openings formed along said one side of the stack of cards, in electrical contact with the terminals within said openings.

2. A method of making connection to printed circuits on the surfaces of cards comprising the steps of:
forming each card with corresponding terminals at an edge of the card, and on the same surface thereof as the circuit;
selectively punching the edges of said cards to remove at least a portion of each of a plurality of terminals;
stacking the cards in such manner that each group of punched out terminal portions on adjacent cards forms an opening along one side of the stack of cards which exposes the terminal on a card beneath the group of punched out terminals and successive openings are in staggered relationship; and
placing a multiple element connector, which is adapted to mate with the openings formed along said one side of the stack of cards, in electrical contact with the terminals within said openings.

3. A method of making connection to printed circuits on the surfaces of cards comprising the steps of:
forming each card with corresponding terminals at an edge of the card, and on the same surface thereof as the circuit;
selectively punching terminal portions out of the cards;
stacking the cards in such manner that each group of punched out terminals on adjacent cards forms an opening along one side of the stack of cards which exposes the terminal on a card beneath the group of punched out terminals;
placing a low-melting-point metal into the openings thereby formed;
heating the metal until it melts;
placing a multiple element connector, which mates with the openings formed along said one side of the stack of cards, into said openings with the elements of the connector immersed in the melted metal; and permitting the metal to solidify.

4. A method of making connection to the conductor on a surface of a card comprising the steps of:
forming a plurality of cards with a terminal in the same position on one surface of each card, and at an edge of each card;
punching the edge portion, including at least a part of said terminal, out of a plurality of cards which will lie immediately above the card with the terminal to which connection is desired;
stacking the cards, whereby the punched out cards form an opening at the edge of the stack exposing the terminal to which connection is desired; and
placing a connector element in electrical contact with the exposed terminal.

5. A method of making connection to cards with aligned terminals on the same surface of each card next to the same edge of each card, comprising the steps of:
punching the same terminal portion out of an edge of a group of cards to provide an opening, when the cards in said group are stacked one next to the other, on which the corresponding terminal of the next card in the stack is exposed;
stacking the cards; and
placing a resilient connector element into the opening to make contact with the exposed terminal.

6. A method of making connection to cards with corresponding terminals on the same surface of each card next to the same edge of each card comprising the steps of:
punching the same terminal portion out of an edge of a group, less than all, cards;
placing the cards in a stack with the cards in said group adjacent to one another and with the terminals on all cards in alignment, whereby the punched out terminal portions in said group of cards together define on opening which exposes a terminal on the next adjacent card;
placing solder into said opening;
melting the solder;
placing a connector element into the melted solder in said opening; and
permitting the solder to solidify.

References Cited by the Examiner

UNITED STATES PATENTS

| | | | |
|---|---|---|---|
| 2,547,022 | 4/1951 | Leno | 339—17 |
| 2,752,537 | 6/1956 | Wolfe | 317—101 |
| 2,845,516 | 7/1958 | Jones | 339—275 |
| 2,926,340 | 2/1960 | Blain et al. | 339—17 |
| 2,967,979 | 1/1961 | Plesser et al. | 339—275 X |
| 3,123,422 | 3/1964 | Mock et al. | 339—275 X |
| 3,184,830 | 5/1965 | Lane et al. | 174—68.5 X |
| 3,191,100 | 6/1965 | Sorvillo | 339—17 X |
| 3,219,749 | 11/1965 | Schuster et al. | 174—68.5 |

FOREIGN PATENTS

| | | |
|---|---|---|
| 854,593 | 11/1960 | Great Britain. |

LEWIS H. MYERS, *Primary Examiner.*

A. S. TRASK, D. L. CLAY, *Assistant Examiners.*